United States Patent [19]

Nakagawa et al.

[11] Patent Number: 4,634,995
[45] Date of Patent: Jan. 6, 1987

[54] ELECTRONIC CIRCUITRY UTILIZING AN INERTED DARLINGTON AMPLIFIER OUTPUT STAGE TO BE OPERABLE WITH A LOW SUPPLY VOLTAGE

[75] Inventors: Isao Nakagawa; Akihiro Yamamoto, both of Katsuta; Koichi Hirose, Yokohama; Yoshinori Okada; Mitsuru Kudo, both of Katsuta, all of Japan

[73] Assignee: Hitachi, Ltd., Tokyo, Japan

[21] Appl. No.: 460,812

[22] Filed: Jan. 25, 1983

[30] Foreign Application Priority Data

Jan. 28, 1982 [JP] Japan ............................. 57-10971
Jul. 28, 1982 [JP] Japan ............................. 57-130304

[51] Int. Cl.[4] ............................................. H03F 3/45
[52] U.S. Cl. ............................................. 330/261
[58] Field of Search ............... 330/252, 256, 261, 257; 307/315, 355, 362, 455

[56] References Cited

U.S. PATENT DOCUMENTS 4,262,220 4/1981 Delacruz ......................... 337/315
4,410,859 10/1983 Kuwahara ....................... 330/257
4,494,075 1/1985 Yoshihisa et al. ................ 330/254

Primary Examiner—Gene Wan
Attorney, Agent, or Firm—Antonelli, Terry & Wands

[57] ABSTRACT

An output section of an electronic circuitry having differentially connected transistors is connected to the emitter of a first transistor having an inverted conductivity type relative to that of differentially connected transistors and to the collector of a second transistor in combination with the first transistor to constitute an inverted Darlington amplifier. The output current is derived from the emitter of the second transistor, so that the electronic circuitry can be operated under the application of a low supply voltage and suited for an integration circuit.

4 Claims, 5 Drawing Figures

ELECTRONIC CIRCUITRY UTILIZING AN INERTED DARLINGTON AMPLIFIER OUTPUT STAGE TO BE OPERABLE WITH A LOW SUPPLY VOLTAGE

This invention relates to an electronic circuitry having a construction suitable for use in an integrated circuit operable with a low supply voltage.

As far as precision of elements formed in the same chip of an integrated circuit is concerned, the absolute precision of individual elements is poor, but the relative precision of these elements can be extremely high. The integrated circuit is also characterized by cheaper formation of active elements such as transistors than of passive elements such as capacitors and resistors. With a view of taking advantage of the above two features, differential amplifier circuits are frequently used as fundamental circuits in the integrated circuit.

For example, in a conventional double balance multiplier circuit as shown in FIG. 1, three differential amplifier circuits are used in combination. This multiplier circuit designed for multiplication has many applications as being applicable to a modulator, a frequency converter, a phase detector, a voltage controlled attenuator and the like.

For example, in a domestic VTR, chrominance signals first undergo frequency conversion into a low frequency band which is below a band of luminance signals subject to FM modulation and then recorded. For this frequency conversion, a circuit of the type shown in FIG. 1 is used in most cases because of its simplicity and excellent performance.

For example, in a typical domestic VTR for recording and reproducing video signals pursuant to the NTSC color system, chrominance signals at a carrier frequency of 3.58 MHz are converted into low frequency band chrominance signals at a carrier frequency of 629 KHz and thereafter recorded. When reproducing the recorded signals, the low frequency band chrominance signals are multiplied by a continuous wave at 4.21 MHz so that the chrominance signals at the 3.58 MHz carrier frequency can be reproduced. While the band of the chrominance signal ranges from −500 KHz to +500 KHz, the continuous wave of 4.21 MHz is only 629 KHz distant from the 3.58 MHz carrier frequency. Therefore, when the reproduced signal is mixed with the 4.21 MHz component, this 4.21 MHz component cannot be eliminated by means of a filter. Accordingly, when the 4.21 MHz continuous wave is applied as an input signal to a multiplier, the amount of 4.21 MHz component mixing in an output signal from the multiplier must be −40 dB or less with respect to the level of the chrominance signal. For the purpose of minimizing the percentage of the input signal mixing in the output signal, the double balance multiplier as shown in FIG. 1 is most suited. With the multiplier, as well known in the art, the 4.21 MHz signal is preferably applied to an input terminal 2 and the converted low-band chrominance signal is preferably applied to an input terminal 3 in order to minimize the 4.21 MHz component mixing in the output signal.

Thus, the FIG. 1 circuit acting as a frequency converter advantageously succeeds in completely eliminating, in principle, and fairly minimizing, in effect, the input signal component mixing in the output signal and its widespread use prevails. This circuit, however, encounters problems when operated with a fairly low supply voltage and in particular, it is incompatible with a portable type VTR to be operated under low power consumption.

More particularly, it will do that the transistor is operated with the base-collector bias voltage reversed. When this bias voltage changes from nearly zero volt to a forward bias, the base-collector capacitance will increase rapidly and the current-amplification factor "hfe" of the transistor measured for small AC signals will decrease rapidly. Therefore, with an excessively low base-collector reverse bias being less than zero volt, an output signal of the transistor corresponding to a high frequency input signal is disadvantageously distorted or leakage of a high frequency input signal component is disadvantageously increased. The base-collector reverse bias must therefore be designed to be at least 0.3 volts.

From this standpoint of view, when it is assumed that the base potential of a transistor $Q_7$ is 1 volt and the input signal amplitude is 0.5 V p-p (peak to peak), the dynamic range of the base potential of transistors $Q_5$ and $Q_6$ is required to be about 1.5 volts in consideration of linearity, so that current flowing through either one of resistors $R_6$ and $R_7$ causes a voltage drop of 0.75 volts across either one resistor. When currents flow through the resistors $R_6$ and $R_7$ equally, a voltage drop of 0.375 volts takes place across either resistor. As the input signal applied through a capacitor $C_2$ goes to a minimum level, a potential difference of 0.25 volts is caused between bases of the transistors $Q_6$ and $Q_5$ and hence the voltage drop across the resistor $R_7$ is added with half the 0.25-volt potential difference, i.e., 0.125 volts, amounting to 0.5 volts. Accordingly, when considering that the base-emitter voltage of the transistor $Q_6$ is about 0.7 volts, that the voltage drop across the resistor $R_7$ is 0.5 volts and that the base-collector reverse bias of the transistor $Q_7$ is 0.3 volts under the application of normal input signals, the emitter potential of a transistor $Q_9$ must be selected so as to be 2.5 volts or more.

The base voltage of the transistor $Q_5$ changes by ±0.25 volts around the center level of 2.5 volts. Therefore, when considering that the level of this change is 0.25 volts, that the minimum base-collector reverse bias of the transistor $Q_5$ is 0.3 volts and that the base-emitter voltage of a transistor $Q_2$ is 0.7 volts, the emitter voltage of a transistor $Q_8$ is required to be 3.75 volts or more. Assuming that the input signal to transistors $Q_1$ and $Q_4$ is also 0.5 $V_{p-p}$, the base potential of the transistors $Q_1$ and $Q_4$ will rise to 4 volts. Accordingly, in order to assure the 0.3-volt reverse bias, the uppermost limit of a signal appearing across a resistor $R_1$ is 0.5 $V_{p-p}$ when a supply voltage $V_{cc}$ applied to a first terminal 1 is 5 volts. (DC voltage is 4.5 volts in the absence of the signal voltage and ±0.25 volts occur around the center level of 4.5 volts.) Practically, in consideration of unevenness of resistance value and transient operation, the uppermost limit will be reduced. When the supply voltage is 4.5 volts, the uppermost limit of a signal appearing across the resistor $R_1$ is 0.1 $V_{p-p}$.

In the frequency modulator, the output signal contains a sum frequency component and a difference frequency component of the input signal and one of these components is needed. Accordingly, when considering the one component, the uppermost limit is halved, amounting to 0.25 volts when the supply voltage is 5 volts and 50 mV when the supply voltage is 4.5 volts.

In general, there needs to be a filter adapted to separate the sum and difference frequency components. In the filter, a matching loss due to matching of the input and output signals takes place and the filter output signal is limited to 0.125 $V_{p-p}$ when the supply voltage is 5 volts and 25 m $V_{p-p}$ when the supply voltage is 4.5 volts.

As will be seen from the foregoing, the permissible output signal level is decreased rapidly as the supply voltage decreases. Thus, pre-processing of the input signal is necessary, for which a differential amplifier is required. This in turn requires DC matching between the amplifier output signal and a succeeding processing circuit, resulting in the necessity of a DC level shift circuit and a capacitor coupling. And, eventually, the number of pins provided for an integrated circuit is inevitably increased.

In addition to the conventional double balance multiplier as shown in FIG. 1, a circuit of the type wherein differential amplifiers are cascaded one of which is biased by the output current from another differential amplifier has widely been used for an integrated circuit because of its excellent performance and simplicity. However, these conventional circuitries are disadvantageous in that the output dynamic range is narrowed when the supply voltage is decreased as described previously. Furthermore, in the conventional circuitries operating under the application of the low supply voltage, the output dynamic range is disadvantageously narrowed for the sake of assuring the dynamic range of its input circuit section which is applied with input signals of large amplitude.

It is therefore an object of this invention to provide an electronic circuit for use in an integrated circuit which can have a sufficiently wide output dynamic range under the application of a low supply voltage.

For this reason, an electronic circuit of this invention has an output circuit section including an inverted conductivity type transistor with its emitter connected to the collector of a transistor constituting an inverted Darlington amplifier in combination with the inverted conductivity type transistor so that the output current is derived from the inverted Darlington amplifier, whereby the signal current can be derived while keeping the voltage drop necessary for the output circuit section minimized and can be returned to the ground potential side so as to be converted into a voltage within a sufficiently wide dynamic range.

A still another object of this invention is to provide an electronic circuit wherein the base potential of an inverted conductivity type transistor is fed from a bias circuit including a first constant current source and a second constant current source cooperative with a third constant current source for a differential amplifier.

The present invention will be apparent from the following detailed description taken in conjunction with the accompanying drawings, in which.

The invention will now be described by referring to preferred embodiments of an electronic circuit according to the invention.

Figure 1:
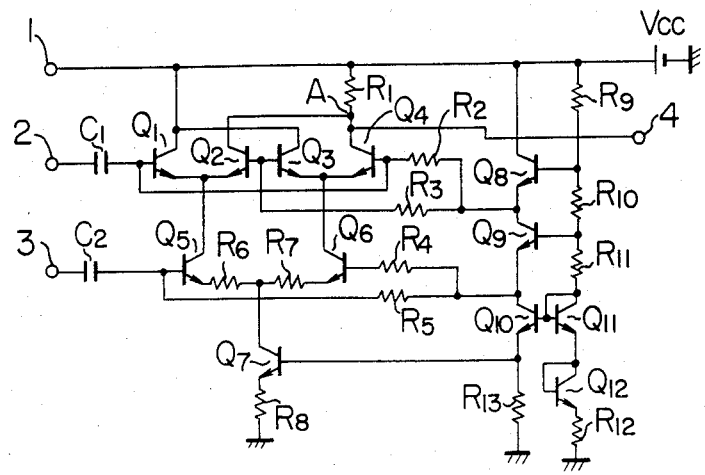
FIG. 1 is a circuit diagram illustrating a conventional electronic curcuit suitable for use in an integrated circuit.
Figure 2:
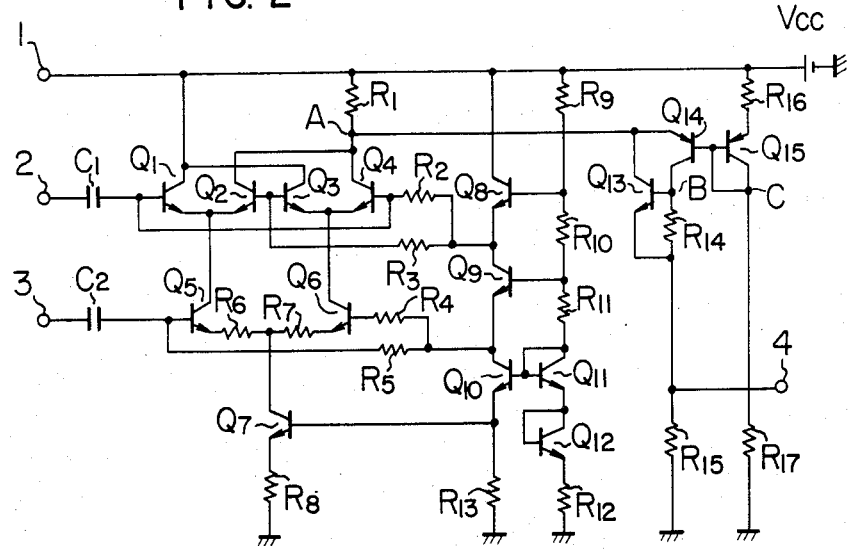
FIG. 2 is a circuit diagram illustrating a first embodiment of an electronic circuit according to the invention.

Reference should first be made to FIG. 2 showing a first embodiment of an electronic circuit according to the invention. In FIG. 2, the same elements as those of FIG. 1 are designated by the same reference numerals. As shown therein, transistors $Q_{14}$ and $Q_{13}$ constitute an inverted Darlington amplifier. The collector voltage of transistors $Q_4$ and $Q_2$ is fixed at the emitter voltage of the transistor $Q_{14}$. Assuming that the voltage drop across a resistor $R_1$ is 0.2 volts, the collector current of a transistor $Q_7$ is designed to be 1 mA and the current passed through the resistor $R_1$ of a resistance value of 200 $\Omega$ is designed to be 1 mA, collector currents of 0.5 mA flow through a combination of the transistors $Q_2$ and $Q_4$ as well as a combination of the transistors $Q_{14}$ and $Q_{13}$ in the absence of the input signal voltage. When the signal current flows through the transistors $Q_2$ and $Q_4$, a signal current of the same magnitude but of opposite polarity is passed through the transistors $Q_{13}$ and $Q_{14}$ since the current of 1 mA is flowing through the resistor $R_1$.

In this manner, the signal current is returned by the inverted Darlington amplifier to the ground potential side. Namely, the signal current is derived from the emitter of the transistor $Q_{13}$. The reason why the use of only the PNP transistor $Q_{14}$ should be avoided is as follows.

On the assumption that the transistor $Q_{13}$ is eliminated and only the transistor $Q_{14}$ is employed, a current of 0.5 mA would be passed through the PNP transistor $Q_{14}$ in the absence of the input signal voltage. At this time, the transistor $Q_{14}$ has an emitter input impedance of about 50 $\Omega$. Consequently, when a small signal current is passed through the collectors of the transistors $Q_2$ and $Q_4$ under this condition, the signal current is distributed by the resistor $R_1$ and the emitter input impedance of the transistor $Q_{14}$ such that 80% of the signal current flows into the transistor $Q_{14}$ and 20% into the resistor $R_1$. For the total current of 0.75 mA in the combination of the transistors $Q_2$ and $Q_4$, on the other hand, it will do that a current of 0.25 mA flows through the transistor $Q_{14}$. At this time, the transistor $Q_{14}$ has an emitter input impedance of about 100 $\Omega$ for the small signal current, and about 67% of the signal current flows into the transistor $Q_{14}$. Since, in this manner, the emitter input impedance of the transistor $Q_{14}$ greatly varies with the bias current, the percentage of the signal current flow varies extensively. This causes a large waveform distortion which prevents practical use of this circuit. Contrary to this, in the inverted Darlington amplifier, the current in the transistor $Q_{13}$ can be controlled by a voltage developing across a resistor $R_{14}$, thus reducing an equivalent emitter input impedance of the transistor $Q_{13}$ to a great extent.

For example, for the resistor $R_{14}$ being of a resistance value of 7 K$\Omega$, the base-emitter voltage of the transistor $Q_{13}$ is about 0.7 volts and a current flow of about 0.1 mA can be obtained. Accordingly, of the current flow of 0.5 mA in the absence of the input signal voltage, about 0.1 mA current flows into the transistor $Q_{14}$ and 0.4 mA current into the transistor $Q_{13}$. Since at this time the transistor $Q_{13}$ has a conductance gm of about 16 m℧ and the transistor $Q_{14}$ has an input impedance of 260 $\Omega$, a current flow $\Delta I$ attendant on a small voltage change $\Delta V$ at the emitter can be expressed as, $$\Delta I = \frac{\Delta V}{260}(1 + 7\,k\Omega \times 16\,m\mho)$$

and then the input impedance Rin is, $$Rin = \frac{\Delta V}{\Delta I} = \frac{260}{1 + 7\,k\Omega \times 16\,m\mho} \approx 2.3\,(\Omega).$$

Accordingly, 99% of the signal current in the combination of the transistors $Q_2$ and $Q_4$ flows into the inverted Darlington amplifier.

On the other hand, when 0.25 mA flows into the inverted Darlington amplifier, the base-emitter voltage of the transistor $Q_{13}$ is required to be substantially the same as that for 0.5 mA current flow and hence, 0.1 mA flows into the transistor $Q_{14}$ and 0.15 mA into the transistor $Q_{13}$. Accordingly, the input impedance R' in this case is obtained similarly and expressed as, $$R'in = \frac{260}{1 + 7\,k\Omega \times 6\,m\mho} \approx 6\,(\Omega).$$

Consequently, in this case, 97% of the signal current in the transistors $Q_2$ and $Q_4$ flows into the inverted Darlington amplifier.

Thus, the percentage of current flow in the inverted Darlington amplifier in the case of 0.5 mA differs from that in the case of 0.25 mA by only 2% and only a differential gain (indicative of the degree of change in the gain of the chrominance signal sub-carrier dependent on the brightness level of the brightness signal and referred to as DG hereinafter of 2% takes place at a peak value of a signal developing at half the dynamic range). Normally, since only input signals developing at ⅓ or less of the dynamic range are applied to the input circuit section in consideration of linearity thereof, the DG amounts, in this case, to only 1% or less even at a peak value.

In this manner, the generation of distortion can be prevented by using the inverted Darlington amplifier. Furthermore, the voltage drop of 0.2 volts across the resistor $R_1$ can afford to provide a basecollector reverse bias of 0.3 volts or more in respect of the transistors $Q_2$ and $Q_4$ for the supply voltage being below 4.5 volts under the operating conditions previously described with reference to the prior art circuitry. Also, due to the fact that the base voltage of the transistor $Q_{14}$ is about 3.6 volts for the supply voltage of 4.5 volts, it is possible to raise the DC voltage at an output terminal to 2.7 volts for the sake of bringing the base-collector reverse bias of the transistor $Q_{14}$ to 0.3 volts. Accordingly, on the assumption that the input signal is allowed to rise to 2.7 volts within ⅓ of the dynamic range, an output signal of at least 1.8 $V_{p-p}$ can be derived. Thus, delivery of the output signal can sufficiently be ensured for the low supply voltage of 4.5 volts.

In FIG. 2, a transistor $Q_{15}$ will be seen which is connected at its base to the base of the transistor $Q_{14}$. This transistor $Q_{15}$ serves for temperature drift compensation (generally, there is temperature drift of about $-1.8$ mV/° C.) for the baseemitter emitter voltage of the transistor $Q_{14}$ by stabilizing a voltage developing across a resistor $R_1$ connected to the emitter of the transistor $Q_{14}$.

Figure 3:
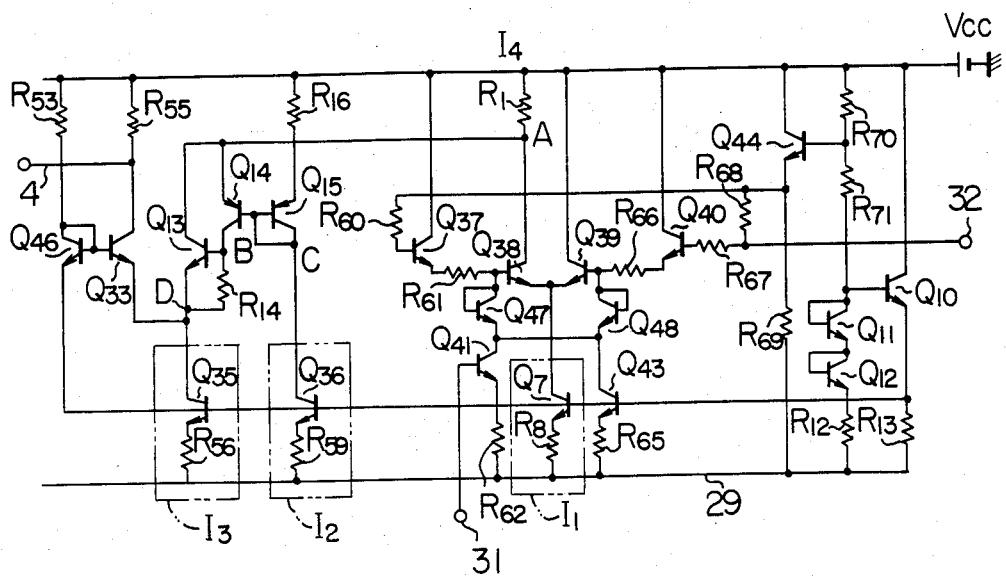
FIG. 3 is a circuit diagram illustrating a second embodiment of the electronic circuit according to the invention.

FIG. 3 shows a second embodiment of the electronic curcuitry according to the invention which is applied to a variable gain amplifier circuit. In FIGS. 2 and 3, the same elements are designated by the same reference numerals.

In FIG. 3, there are provided transistors $Q_{10}$ to $Q_{15}$, $Q_{33}$, $Q_{35}$ to $Q_{41}$, $Q_{43}$ to $Q_{44}$ and $Q_{46}$ and $Q_{47}$, resistors $R_1$, $R_8$, $R_{12}$, $R_{13}$, $R_{14}$, $R_{16}$, $R_{53}$, $R_{55}$, $R_{56}$, $R_{59}$, $R_{60}$ to $R_{62}$ and $R_{65}$ to $R_{71}$, a ground line 29, an output signal terminal 4, a gain control signal input terminal 31, and an input signal terminal 32.

The transistors $Q_{13}$ and $Q_{14}$ constitute an inverted Darlington amplifier. The transistor $Q_{14}$ is applied with a constant base voltage by means of a second constant current source $I_2$ comprised of the transistor $Q_{36}$ and resistor $R_{59}$, the transistor $Q_{15}$ in diode connection, and the resistor $R_{16}$. The transistor $Q_{35}$ and resistor $Rk_{56}$ constitute a third constant current source $I_3$, and the transistor $Q_{46}$ in diode connection, resistor $R_{53}$ and transistor $Q_{33}$ constitute a grounded base amplifier.

The collector voltage of the transistor $Q_{38}$ is fixed at the emitter voltage of the transistor $Q_{14}$. It is now assumed for instance that the base voltage of the transistor $Q_{14}$ is established so that the voltage drop across the resistor $R_1$ may be 0.2 volts, that the resistor $R_1$ has a resistance value of 100 $\Omega$, and that the collector current in a transistor $Q_7$ is set to 2 mA, the current flowing through the transistor $Q_{38}$ is 1 mA and the current flowing through a combination of the transistors $Q_{14}$ and $Q_{13}$ is 1 mA in the absence of the input signal voltage. When the signal current flows through the transistor $Q_{38}$, a current of the same magnitude but of opposite polarity is passed through the transistors $Q_{14}$ and $Q_{13}$ since the current flow in the resistor $R_1$ is always 2 mA. Thus, the signal current is returned to the ground potential side by the inverted Darlington amplifier. Assuming that the current flow in the third constant current source $I_3$ comprised of the transistor $Q_{35}$ and resistor $R_{56}$ is 2 mA, the signal current returned to the ground potential side is again returned to the supply voltage side through the transistor $Q_{33}$ constituting the grounded base amplifier, and a signal voltage is delivered out of the output terminal 4.

In this case, since the collector voltage of the transistor $Q_{38}$ must be 3.3 volts or more, in consideration of the voltage drop across the resistor $R_1$ being 0.2 volts, it will do that the supply voltage is 3.5 volts or more. On the other hand, the voltage between the emitters of the transistors $Q_{14}$ and $Q_{13}$ is required to be 0.7 V×2+0.3 V=1.7 V in consideration of the base-collector inverse bias being 0.3 volts. Also, for normal operation of the transistor $Q_{35}$, it is necessary that the collector voltage of the transistor $Q_{35}$ should be 1.3 volts or more. Under these conditions, the voltage between the emitters of the transistors $Q_{14}$ and $Q_{13}$ can be 3.3 V−1.3 V=2.0 V even when the collector voltage of the transistor $Q_{38}$ is 3.3 volts, thereby ensuring that the inverted Darlington amplifier comprised of the transistor $Q_{14}$ and $Q_{13}$ can normally be operated.

Further, in order to assure normal operation of the transistor $Q_{33}$, the collector voltage of the transistor $Q_{33}$ must be 2.0 volts or more. Accordingly, for obtaining an output signal voltage of 1.0 $Vh_{p-p}$, the supply voltage may be at least 2.0 V+1.0 V×2=4 V, indicating that a lower voltage drive can be assured as compared to the conventional drive voltage which is 5.3 volts or more.

Although, in the foregoing embodiment, the current flow in the third constant current source $I_3$ comprised of the transistor $Q_{35}$ and resistor $R_{56}$ has been set to 2 mA which is equal to that in a first constant current source $I_1$ comprised of the transistor $Q_7$ and resistor $R_8$ and the resistor $R_1$ as well, the supply voltage may further be reduced by reducing the current flow in the third constant current source $I_3$. More particularly, when considering that the current flow in the collector of the transistor $Q_{33}$ in the foregoing embodiment varies with only the signal component around 1 mA, the reduction in the current flow in the constant current source $I_3$ will simply reduce the average current flow in the collector of the transistor $Q_{33}$ while keeping the change of current corresponding to the signal component unchanged, so that the base-collector inverse bias voltage of the transistor $Q_{33}$ will simply be increased by a voltage $V_3$ corresponding to a product of the reduction in the current flow in the constant current source $I_3$ and a resistance value of the resistor $R_{55}$. Consequently, the supply voltage can be reduced by the voltage $V_3$. If the current flow in the constant current source $I_3$ is decreased below a maximum current flow in the transistor $Q_{13}$, the output signal delivered out of the output terminal 4 will of course be distorted. In other words, the supply voltage must have a minimum value of 3.0 volts which is a sum of 2.0 volts necessary for the collector of the transistor $Q_{33}$ and 1 $V_{p-p}$ of the output signal amplitude. Accordingly, in consideration of the minimum value and the base-collector inverse bias of the transistor $Q_{38}$, the minimum supply voltage for the variable gain amplifier as shown in FIG. 3 is determined as 3.5 volts as described previously.

In this embodiment, variations in the output voltage from the output terminal 4 due to temperature characteristics and unevenness of elements in the integrated circuit can advantageously be reduced to a great extent by supplying the base voltage to the transistor $Q_{14}$ by means of the second constant current source $I_2$ comprised of the transistor $Q_{36}$ and resistor $R_{59}$ and a bias circuit comprised of the resistor $R_{16}$ and transistor $Q_{15}$ in diode connection. This compensation circuit for temperature characteristics and unevenness corresponds to a circuit in FIG. 2 which comprises the transistor $Q_{15}$ and resistors $R_{16}$ and $R_{17}$.

To detail in this respect, the output voltage from the output terminal 4 herein designated by $$V_{out} = V_{cc} - R_{55} \times \left\{ I_3 - \left( I_4 = \frac{I_1}{2} \right) \right\}$$

in the absence of the input signal voltage, where $V_{cc}$ is the supply voltage, $R_{55}$ is a resistance value of the resistor $R_{55}$, and $I_1$, $I_2$ and $I_3$ are current flows in the first, second and third constant current sources. It is to be noted that R with suffix herein represents a resistance value of the corresponding resistor and V with suffix a voltage drop across the corresponding resistor.

Then, assuming that the emitter voltage of the transistor $Q_{10}$ is $V_E + V_{BE}$, where $V_E$ is the emitter potential and $V_{BE}$ is the base-collector voltage whose relative difference can readily be reduced greatly by properly arranging the transistor in the integrated circuit, the output voltage $V_{out}$ can be expressed as, $$V_{out} \approx V_{cc} - R_{55} \times \left( \frac{V_E}{R_{56}} + \frac{V_E}{2 \cdot R_8} - \frac{V_{R1}}{R_1} \right).$$

Further, since the transistor $Q_{14}$ and the transistor $Q_{15}$ in diode connection can be designed to have substantially the same $V_{BE}$, the voltage drop $V_{R1}$ is $$V_E \times \frac{R_{16}}{R_{56}}$$

and then, $$V_{out} \approx V_{cc} - \left( \frac{R_{55}}{R_{56}} + \frac{R_{55}}{2 \cdot R_8} - \frac{R_{55}}{R_1} \times \frac{R_{16}}{R_{59}} \right) V_E$$

stands. The emitter voltage $V_E$ is, on the other hand, determined approximately by a relative ratio between $R_{70}$, $R_{71}$ and $R_{12}$. Such a relative ratio can be determined with high accuracy in the integrated circuit by properly arranging the resistors as in the case of the transistor and hence, with the bias circuit as shown in FIG. 3, it is possible to obtain the output voltage $V_{out}$ which is fairly less affected by temperature changes and unevenness of the elements. This minimizes tolerance for unevenness and temperature characteristics of the elements, thus making it possible to achieve further reduction in the drive voltage and materialize a highly reliable integrated circuit.

The reason why in this embodiment the use of only the PNP transistor should be avoided and the inverted Darlington amplifier should be used is as follows. On the assumption that the transistor $Q_{13}$ is eliminated and only the transistor $Q_{14}$ is employed, a current of 1 mA would be passed through the PNP transistor $Q_{14}$ in the absence of the input signal voltage. At this time, the transistor $Q_{14}$ has an emitter input impedance of about 26 Ω. Consequently, when a small signal current is passed through the collector of the transistor $Q_{38}$ under this condition, the signal current is distributed by the resistor $R_1$ and the emitter input impedance of the transistor $Q_{14}$ such that $$80\% \left( = \frac{100\Omega}{100\Omega + 26\Omega} \times 100 \right)$$

of the signal current flows into the transistor $Q_{14}$ and 20% into the resistor R. For the current of 1.5 mA in the transistor $Q_{38}$, on the other hand, it will do that a current of 0.5 mA flows through the transistor $Q_{14}$. At this time, the transistor $Q_{14}$ has an emitter input impedance of about 52 Ω for the small signal current, and about 67% of the signal current flows into the transistor $Q_{14}$. Since, in this manner, the emitter input impedance of the transistor $Q_{14}$ greatly varies with the bias current, the percentage of the signal current flow in the collector of the transistor $Q_{14}$ varies extensively. This causes a large waveform distortion which prevents practical use of this circuit.

Contrary to this, in the inverted Darlington amplifier, the current in the transistor $Q_{13}$ can be controlled by a voltage (about 0.7 volts) developing across the resistor $R_{14}$, thus reducing an equivalent emitter input impedance of the transistor $Q_{13}$ to a great extent.

For example, for the resistor $R_{14}$ being of a resistance value of 7 KΩ, the base-emitter voltage of the transistor $Q_{13}$ is about 0.7 volts and a current flow of about 0.1 mA can be obtained. Accordingly, of the current flow of 1 mA into the transistors $Q_{14}$ and $Q_{13}$ in the absence of the input signal voltage, about 0.1 mA current flows into the transistor $Q_{14}$ and the remainder of 0.9 mA current into the transistor $Q_{13}$. Since at this time the transistor $Q_{13}$ has a conductance gm of about 34 m$\mu$ and the transistor $Q_{14}$ has an input impedance of 260 $\Omega$, a current flow $\Delta I$ attendant on a small voltage change $\Delta V$ at the emitter can be expressed as, $$\Delta I = \frac{\Delta V}{260} (1 + 7 K\Omega + 34 m\mho)$$

and then the input impedance Rin is, $$Rin = \frac{\Delta V}{\Delta I} = \frac{260}{1 + 7 K\Omega \times 34 m\mho} \approx 1.1 \ \Omega$$

Accordingly, $$99\% \left( = \frac{100\Omega}{100\Omega + 1.1\Omega} \times 100 \right)$$

of the signal current in the transistor $Q_{38}$ flows into the inverted Darlington amplifier.

On the other hand, when 0.5 mA flows into the inverted Darlington amplifier, the base-emitter voltage of the transistor $Q_{13}$ is required to be substantially the same as that for 1 Ma current flow and hence, 0.1 mA flows into the transistor $Q_{14}$ and 0.4 mA into the transistor $Q_{13}$. Accordingly, the input impedance R' in in this case is obtained similarly and expressed as, $$R'in = \frac{260}{1 + 7 K\Omega \times 15 m\mho} = 2.4 \ (\Omega).$$

Consequently, in this case, $$98\% \left( = \frac{100}{100 + 2.4} \times 100 \right)$$

of the signal current in the transistor $Q_{38}$ flows into the inverted Darlington amplifier. Thus, the percentage of current flow into the inverted Darlington amplifier in the case of 1 mA current flow in the transistor $Q_{38}$ differs from that in the case of 0.5 mA by only 1% and only a DG of 2% takes place at a peak value of a signal developing at half the dynamic range. In this manner, the generation of distortion can be reduced to a great extent by using the inverted Darlington amplifier.

Figure 4:
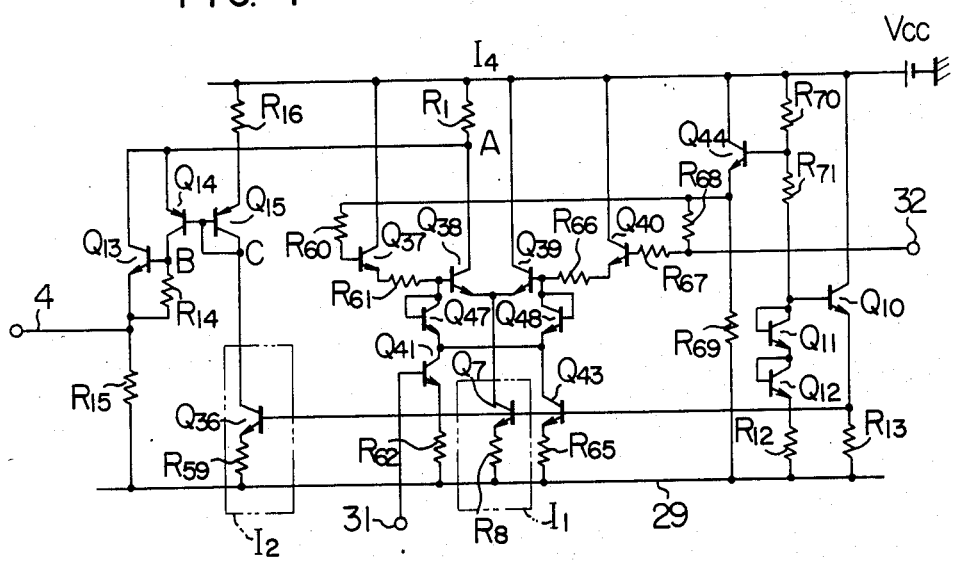
FIG. 4 is a circuit daigram illustrating a third embodiment of the electronic circuit according to the invention.

FIG. 4 shows a third embodiment of the electronic circuitry according to the invention. In FIGS. 3 and 4, the same elements are designated by the same reference numerals. This embodiment does not employ the constant current source comprised of the transistor $Q_{35}$ and resistor $R_{56}$ as well as the grounded base transistor circuit including as a principal part the transistor $Q_{33}$ but otherwise, it is constructed such that the output signal is derived from one end of a resistor $R_{15}$, thus obviously attaining the same effects as obtained from the embodiment of FIG. 3.

While in the foregoing the electronic circuit of the invention has been described by way of the variable gain amplifier circuit with reference to FIGS. 3 and 4, the present invention may obviously be applicable to all the circuits of the type wherein a sufficiently large output signal amplitude must be derived from a circuit treating a large amplitude input signal or wherein differential amplifiers are cascaded.

Figure 5:
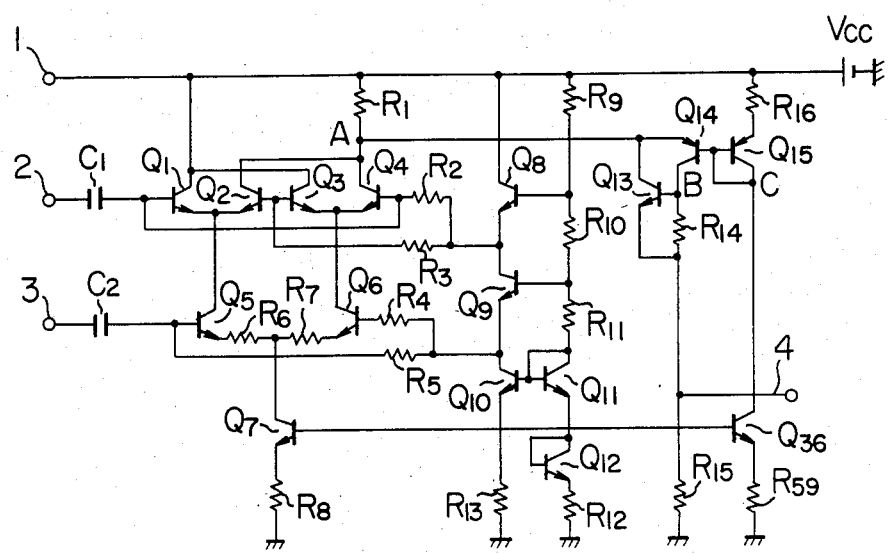
FIG. 5 is a circuit diagram illustrating a fourth embodiment of the electronic circuit according to the invention.

FIG. 5 shows a fourth embodiment of the electronic circuitry according to the invention. In this embodiment, differential amplifiers are cascaded to constitute a double balance multiplier in which a transistor $Q_{87}$ and a resistor $R_{106}$ connected thereto substitute for a resistor $R_{17}$ in FIG. 2 and have connection to a constant current source for the differential amplifier, thus obviously attaining the same effects as obtained from the foregoing embodiments.

It will be appreciated that the predominantly used NPN transistors, and the PNP transistor used for the inverted Darlington amplifier in the foregoing embodiments may of course be replaced with PNP transistors and an NPN transistor for the same purpose.

As has been described, since according to the invention, variations in the output voltage can be reduced and the output dynamic range can be expanded by merely adding a circuit of simple construction, the invention can be applied to an integrated circuit operating with a low supply voltage to provide a simplified circuit which can save power consumption, eliminate unevenness of the elements in the integrated circuits and compensate for temperature characteristics of the elements. Therefore, the integrated circuit can be reduced by itself in power consumption and size and a device such as a VTR incorporating the integrated circuit can eventually be reduced in power consumption and size.

We claim:
1. An electronic circuit operable with a low voltage supply comprising:
   a differentially connected pair of transistors each having a first conductivity type;
   a first constant current source for supplying a bias current for operating said differentially connected pair of transistors;
   a first resistor connected between a reference voltage and a collector of at least one of said transistor of said differentially connected pair of transistors;
   a first transistor having a second conductivity type opposite to said first conductivity type, said first transistor having an emitter connected to a junction point of said first resistor and said collector of said at least one of said transistors of said differentially connected pair of transistors; and
   a second transistor having said first conductivity type, said second transistor having a collector connected to said junction point,
   wherein a base of said second transistor is coupled to a collector of said first transistor so that said first transistor and said second transistor form an inverted Darlington amplifier, and
   wherein said electronic current further comprises a third transistor coupled in diode connection and having it base connected to the base of the first transistor, for unevenness and temperature compensation of the base voltage of said first transistor, and further
   wherein a second constant current source is connected to a collector of said third transistor and there is a correlation between a current value of said first constant current source and a current value of said second constant current source.
2. an electronic circuit operable with a low voltage supply comprising:
   a differentially connected pair of transistors each having a first conductivity type;

a first constant current source for supplying a bias current for operating said differentially connected pair of transistors:

a first resistor connected between a reference voltage and a collector of at least one of said transistors of said differentially connected pair of transistors;

a first transistor having a second conductivity type opposite to said first conductivity type, said first transistor having an emitter connected to a junction point of said first resistor and said collector of said at least one of said transistors of said differentially connected pair of transistors; and a second transistor having said first conductivity type, said second transistor having a collector to said junction point, wherein a base of said second transistor is coupled to a collector of said first transistor so that said first transistor and said second transistor form an inverted Darlington amplifier, wherein said differentially connected pair of transistors comprises a differential amplifier comprised of a pair of fourth and fifth transistors and the first constant current source, wherein said first resistor is connected between a signal output section of said differential amplifier and a reference potential, a junction between the base of said second transistor and the collector of said first transistor is connected to the emitter of said second transistor through a second resistor, the base/collector of a third transistor having the same conductivity type as that of said first transistor, a third resistor is connected between the emitter of said third transistor and said reference potential, a junction between the base/collector of said third transistor and the base of said first transistor is connected to a second constant current source, and current values of said first and second constant current sources are correlated to each other.

3. An electronic circuit according to claim 2 wherein the emitter of said second transistor is connected to the emitter of a sixth transistor constituting an amplifier.

4. An electronic circuitry according to claim 4 wherein the base of said sixth transistor is connected to the base/collector of a seventh transistor, the emitter of said seventh transistor and a junction between the emitters of said second and sixth transistors are connected to a third constant current source.

* * * * *